United States Patent
Jung

(10) Patent No.: US 7,688,642 B2
(45) Date of Patent: Mar. 30, 2010

(54) NON-VOLATILE MEMORY DEVICE AND METHOD FOR PROGRAMMING/ERASING THE SAME

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 368 days.

(21) Appl. No.: 11/800,555

(22) Filed: May 4, 2007

(65) Prior Publication Data
US 2007/0211541 A1 Sep. 13, 2007

Related U.S. Application Data

(62) Division of application No. 11/196,641, filed on Aug. 2, 2005, now abandoned.

(30) Foreign Application Priority Data
Aug. 2, 2004 (KR) .................. 10-2004-0060827

(51) Int. Cl.
*G11C 11/34* (2006.01)
(52) U.S. Cl. .................. 365/185.27; 365/185.29; 365/185.3; 365/218
(58) Field of Classification Search ............ 365/185.28, 365/185.29, 185.3, 185.03, 185.24, 185.27, 365/218
See application file for complete search history.

(56) References Cited

U.S. PATENT DOCUMENTS

| | | | |
|---|---|---|---|
| 5,679,591 A | 10/1997 | Lin et al. | |
| 5,774,400 A * | 6/1998 | Lancaster et al. | 365/185.29 |
| 6,614,693 B1 * | 9/2003 | Lee et al. | 365/185.29 |
| 6,687,648 B1 * | 2/2004 | Kumar et al. | 702/181 |
| 6,760,270 B2 * | 7/2004 | Chindalore et al. | 365/218 |
| 6,791,883 B2 * | 9/2004 | Swift et al. | 365/185.18 |
| 6,834,012 B1 * | 12/2004 | He et al. | 365/185.3 |
| 7,187,590 B2 * | 3/2007 | Zous et al. | 365/185.3 |
| 2004/0062076 A1 | 4/2004 | Hsu et al. | |
| 2005/0169055 A1 | 8/2005 | Lung | |

* cited by examiner

*Primary Examiner*—Tuan T Nguyen
*Assistant Examiner*—Alexander Sofocleous
(74) *Attorney, Agent, or Firm*—The Law Offices of Andrew D. Fortney; Andrew D. Fortney

(57) ABSTRACT

Provided are a SONGS type nonvolatile or flash memory device and related programming/erasing methods. The device has a deep well region of a first conductive type that isolates a well region of a second conductive type from a substrate to enhance programming and erasing operation characteristics. In the erasing method, first electrons are erased by one of Hot Hole Injection (e.g., gate-to-drain Hot Hole Injection) or tunneling in a first step, and second electrons that are not erased in the first step are erased by the other of tunneling (e.g., gate-to-body tunneling) or HHI in a second step. Preferably, a time gap intervenes between the first and second steps.

19 Claims, 7 Drawing Sheets

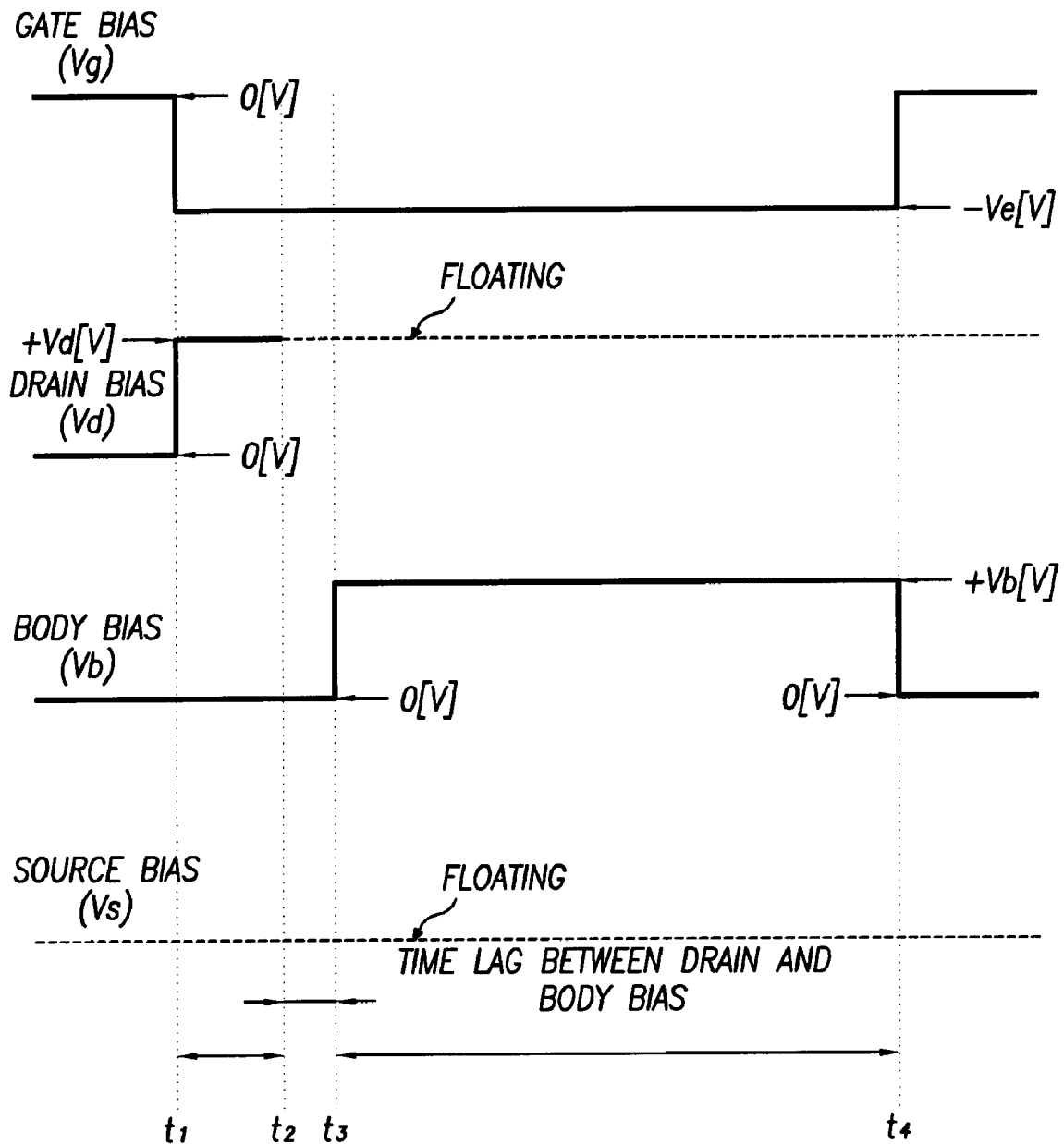

NON-VOLATILE MEMORY DEVICE AND METHOD FOR PROGRAMMING/ERASING THE SAME

RELATED APPLICATION(S)

This application is a divisional of U.S. patent application Ser. No. 11/196,641, filed Aug. 2, 2005, now abandoned. This application also claims the benefit of the Korean Patent Application No. P2004-0060827 filed on Aug. 2, 2004, which is hereby incorporated by reference as if fully set forth herein.

BACKGROUND OF THE INVENTION

1. Field of the Invention

The present invention relates generally to a semiconductor device and, more particularly, to a SONOS (silicon-oxide-nitride-oxide-silicon) type non-volatile (e.g., flash) memory device having a deep well region for isolating a well region from a substrate to enhance programming and erasing operation characteristics, and related programming/erasing methods.

2. Description of the Related Art

Flash memory is non-volatile, which means that it stores data even when power is turned off. While normal EEPROM (electrically erasable and programmable read only memory) only allows one location at a time to be erased or written, flash EEPROM can operate at higher effective speeds to read and write to different locations at the same time.

Flash memory is based on floating gate type cells. Recently as device integration has advanced, there has been a strong need to reduce the size of conventional floating gate type cells.

For the above reasons, alternatives to floating gate cells have been widely studied, for example, SONOS, FeRAM, SET, NROM, etc. Among them, the SONOS cell has attracted considerable attention as next-generation cell structure for replacing a stacked floating gate cell structure.

Hereinafter, a conventional SONOS type flash memory device will be described.

FIG. 1 is a cross-sectional view showing a conventional SONOS type flash memory device. Referring to FIG. 1, the SONOS flash memory device, which may be essentially an NMOS transistor, includes a tunnel oxide layer 12, a trap nitride layer 13, a block oxide layer 14, and a gate 15 formed of N+ type polysilicon, all of which are formed on a portion of a substrate 10 and stacked in sequence. Source and drain 11 having implanted N+ type impurities are formed in the substrate 10, adjacent to both sides of the gate 15.

FIG. 2 is a cross-sectional view showing a conventional method for programming a SONOS type flash memory device. Referring to FIG. 2, bias conditions when programming the SONOS device include applying a positive voltage to both the drain 11a and the gate 15, and to ground both the source 11b and the substrate 10. Voltage applied to the gate 15 and the drain 11a creates a vertical and horizontal electric field in a direction of the length of a channel region from the source 11b to the drain 11a. By the electric field, electrons start flowing from the source 11b to the drain 11a. Then, electrons moving along the channel obtain energy enough to jump over the potential barrier of the tunnel oxide layer 12 and to enter the electron trap layer. That is, electrons are in a 'hot' state. Such a phenomenon may happen frequently near the drain 11a, because electrons near the drain 11a obtain relatively greater energy. Hot electrons injected into the trap nitride layer 13 are trapped therein, and therefore the threshold voltage of the SONOS flash memory device is increased.

Such a programming process is called Channel Hot Electron Injection (CHEI). During this process, an area where electrons are caught in the trap nitride layer 13 is indicated by a referential character A in FIG. 2.

In addition to CHEI, Fowler Nordheim Tunneling (F/N tunneling) may be used as programming methods of the SONOS flash memory device. At present, since F/N tunneling requires relatively higher voltage, the CHEI method is much preferred.

FIG. 3 is a cross-sectional view showing a conventional method for erasing a SONOS type flash memory device. Referring to FIG. 3, bias conditions when erasing the SONOS device include applying a positive voltage to the drain 11a and a negative voltage to the gate 15, and to ground or float both the source 11b and the substrate 10.

Under the above bias conditions, a high electric field is created in an overlapped region between the drain 11a and the gate 15, and thereby a depletion region (indicated by a referential character C) is formed near the drain 11a. In the depletion region, electron/hole pairs are produced by band-to-band tunneling. These electrons are drained to an N+ impurity region of the drain 11a. On the other hand, holes are accelerated by a lateral electric field generated in the depletion region and thereby turned into hot holes. These hot holes jump over energy barrier between the tunnel oxide layer 12 and the silicon substrate 10, and are injected into a valence band of the trap nitride layer 13. Injected hot holes are then trapped in a trap level within the trap nitride layer 13, and neutralized by reacting with electrons stored during programming, so cells are erased. Through this erasing process, the threshold voltage of the SONGS flash memory device is decreased.

Such an erasing process is called Hot Hole Injection (HHI). During this process, an area where hot holes are caught in the trap nitride layer 13 is limited to a relatively smaller local part indicated by a referential character B in FIG. 3, so erasing operation generally takes place in a smaller area than the area (A in FIG. 2) receiving hot electrons during programming operation. As a result, electrons may undesirably remain in a non-overlapped part between areas A and B.

FIG. 4 is a cross-sectional view showing a conventional method for reading a SONOS type flash memory device. Referring to FIG. 4, bias conditions when reading the SONOS device include applying a positive reference voltage to the gate 15 and a positive voltage to the source 11b, and to ground both the drain 11a and the substrate 10. Under the above bias conditions, electric current flows or not according to programming/erasing states near the drain 11a, so it is possible to read whether an operating state is programming or erasing. That is, to know whether the cell is a programming state or an erasing state is based on detection of current that flows when a reference voltage is applied to the gate. If the current is above a predefined current, the cell is in an erasing state. If the current is below the predefined current, the cell is in a programming state. Such a reading process is called Reverse Reading.

Unfortunately, the above-discussed conventional SONOS flash memory device may have the following drawbacks.

The conventional SONOS flash memory device uses Channel Hot Electron Injection programming method and Hot Hole Injection erasing method. However, in such programming/erasing methods, hot electron injecting and hot hole injecting may occur at non-coincident places, so electrons injected to locations not being neutralized by hot hole injection may accumulate in the trap layer relatively near to the center of the channel. Accordingly, the programming threshold voltage and the erasing threshold voltage may increase in comparison with the initial threshold voltages.

In addition, during an erasing operation, the non-volatile memory device may be configured to inject a number of hot holes to the trap layer roughly equivalent to the number of stored electrons. However, as discussed above, the area in which such hot holes are injected (e.g., B in FIG. 3) is smaller than the area where hot electrons are injected (e.g., A in FIG. 2). As a result, over repeated cycles of programming and erasing, hot holes may accumulate at an edge region of the trap layer, near the N+ impurity region such as the source or the drain 11a (see FIG. 3). After many cycles of programming and erasing, the accumulated charges and/or holes may adversely affect reading, programming and/or erasing operations, and may shorten the endurance of the memory device.

Endurance means the characteristic that the threshold voltage is not changed significantly or is changed only within a permissible range while the programming/erasing operations of the device are repeated. The conventional SONOS flash memory device may sometimes have a less than ideal endurance characteristic.

SUMMARY OF THE INVENTION

Exemplary, non-limiting embodiments of the present invention provide a non-volatile (e.g., flash) memory device, which comprises a deep well region of a first conductive type in a semiconductor substrate; a well region of a second conductive type in the semiconductor substrate, isolated from the semiconductor substrate by the deep well region; a stack structure on a channel region of the semiconductor substrate, having a tunnel oxide layer, a trap nitride layer, and a block oxide layer; a gate on the block oxide layer; and source/drain regions having first conductive type impurity ions in a surface of the well region in the semiconductor substrate, adjacent to both sides of the gate.

Exemplary embodiments of the present invention still further provide a method of erasing a non-volatile (e.g., flash) memory device in which a first conductive type deep well region in a semiconductor substrate isolates a second conductive type well region from the semiconductor substrate, the well having source/drain regions therein, the method comprising erasing first electrons by one of Hot Hole Injection (e.g., gate-to-drain Hot Hole Injection) or tunneling in a first step; and erasing second electrons that are not erased in the first step by the other of Hot Hole Injection or tunneling (e.g., gate-to-body tunneling) in a second step.

In the exemplary method, a negative voltage may be applied to a gate at the start of the first step and maintained till the end of the second step. Further, a positive voltage may be applied to the drain region during the first step and a floating state may be maintained thereafter. Also, a ground body bias (e.g., a zero voltage) may be applied to the second conductive type well in the first step, and in the third step, a positive voltage body bias may be applied.

In addition, between the first and second steps, the method may include a (predetermined) time gap after the first erasing step (e.g., by gate-to-drain hot hole injection) and before the second erasing step (e.g., by gate-to-body tunneling).

BRIEF DESCRIPTION OF THE DRAWINGS

FIG. 7 is a waveform diagram of applied bias during erasing operation of a flash memory device in accordance with the present invention.

DETAILED DESCRIPTION OF THE INVENTION

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements.

Embodiments of the present invention provide SONOS type flash memory device having high reliability and high performance by enhancing the endurance characteristic of the SONOS flash memory device that uses a Channel Hot Electron Injection (CHEI) programming method and a Hot Hole Injection (HHI) erasing method.

In the following descriptions, first and second conductive type impurity ions mean refer to complementary (e.g., n-type and p-type impurity ions, or vice versa).

Figure 1:
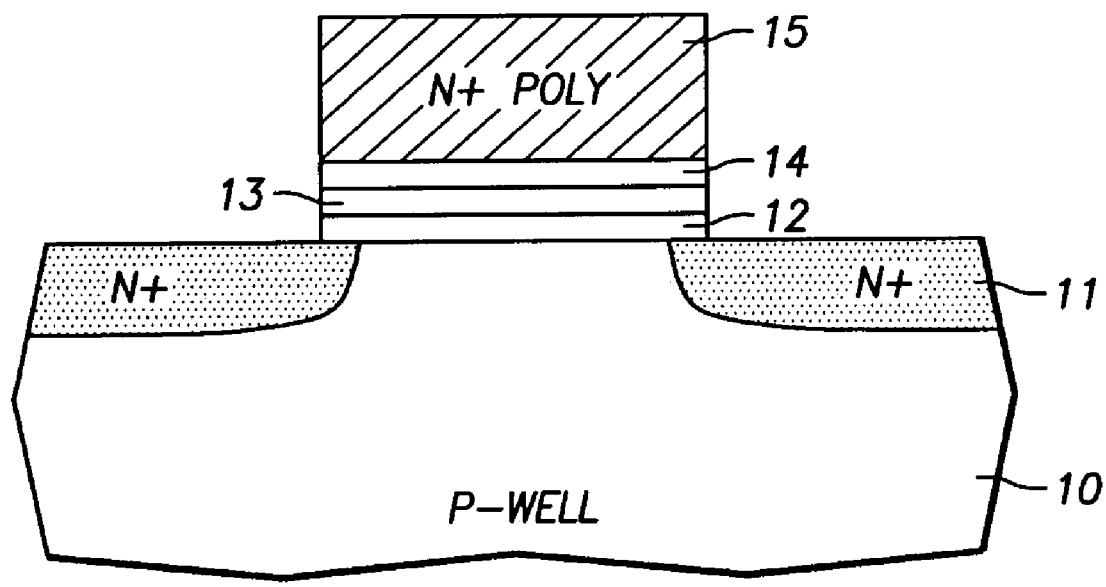
FIG. 1 is a cross-sectional view showing a conventional SONOS type flash memory device.
Figure 2:
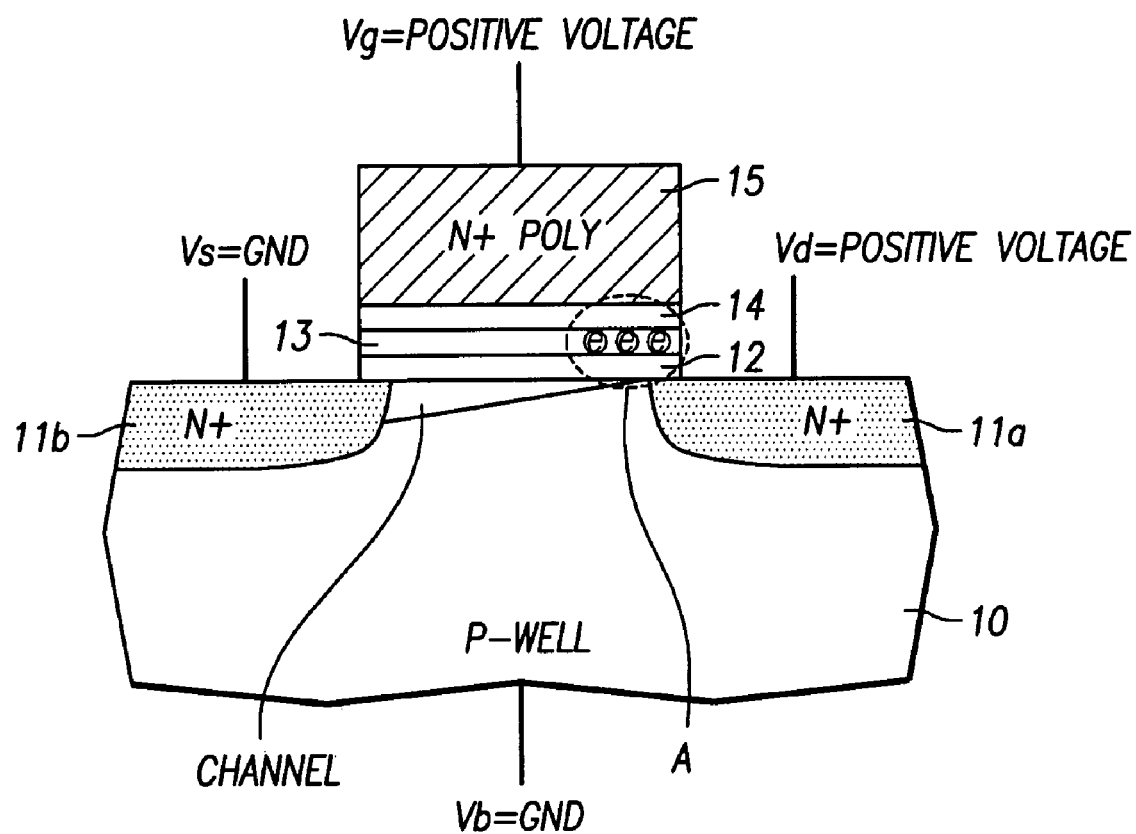
FIG. 2 is a cross-sectional view showing a conventional method for programming a SONOS type flash memory device.
Figure 3:
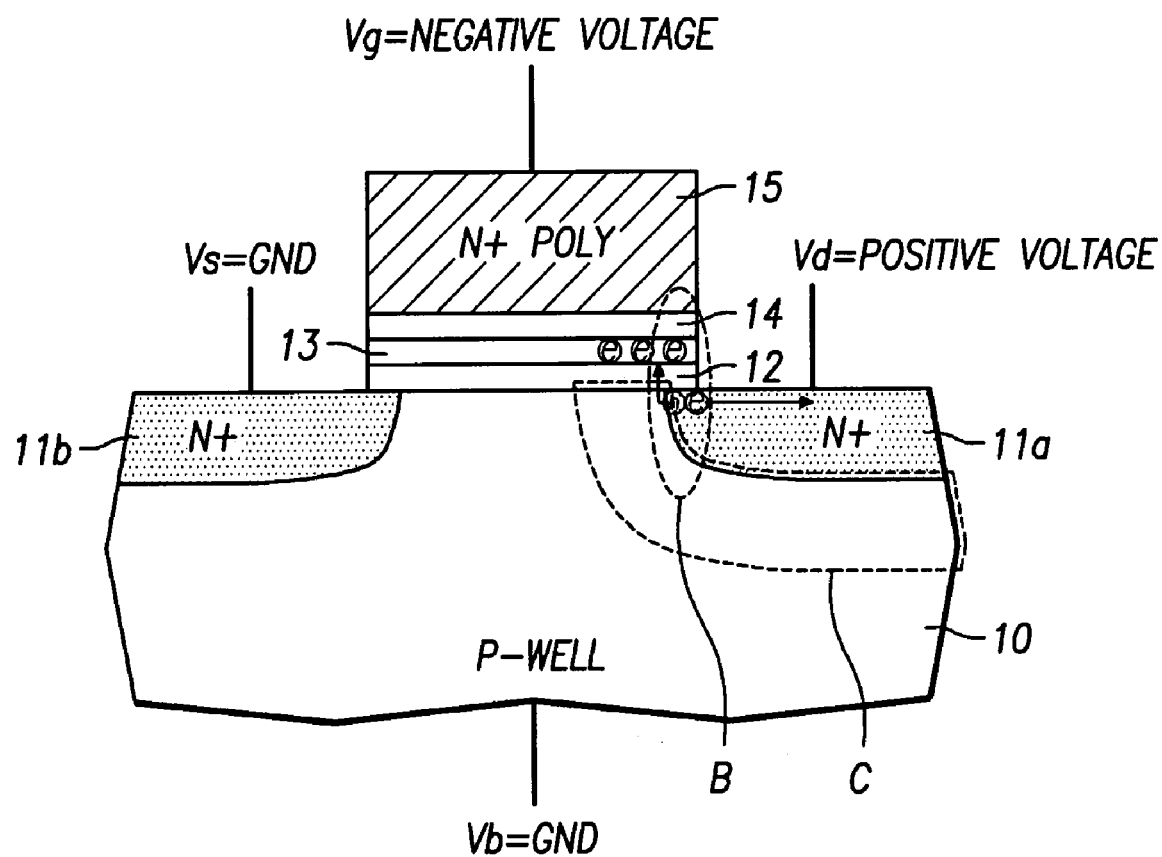
FIG. 3 is a cross-sectional view showing a conventional method for erasing a SONOS type flash memory device.
Figure 4:
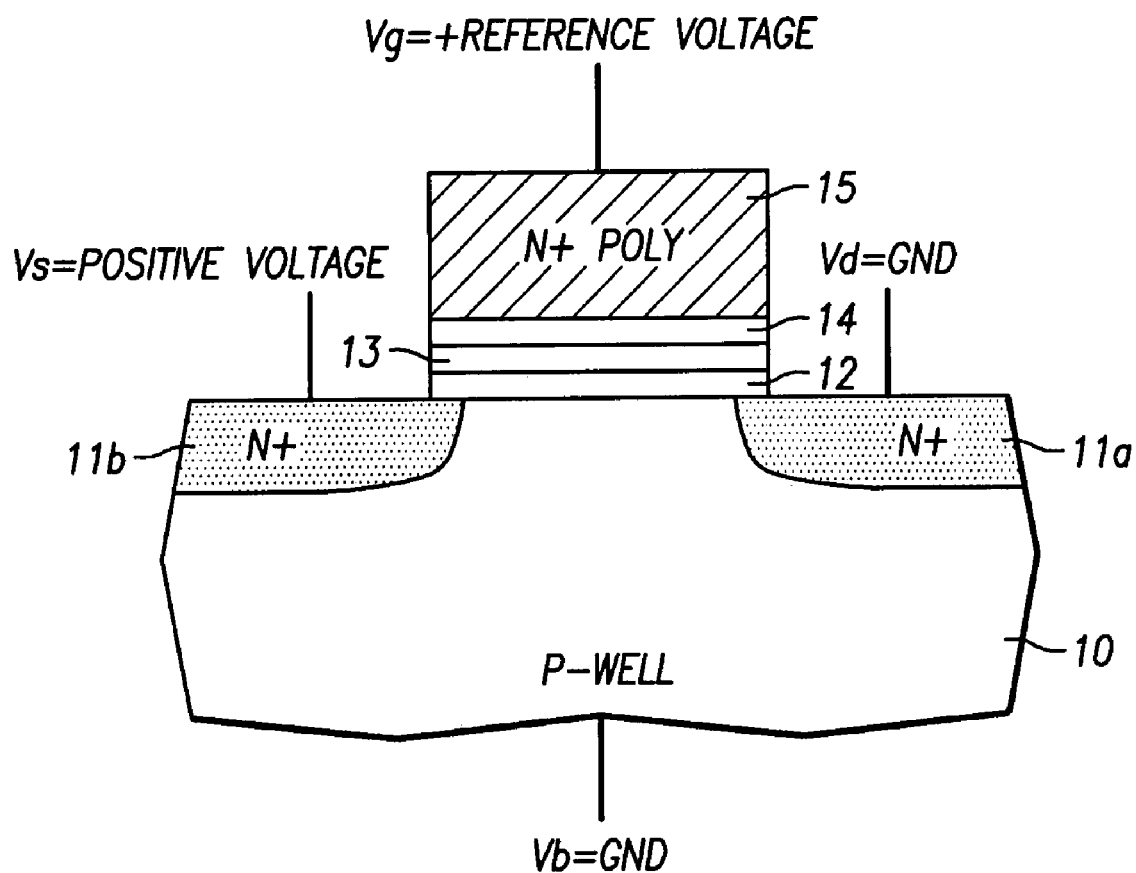
FIG. 4 is a cross-sectional view showing a conventional method for reading a SONOS type flash memory device.
Figure 5:
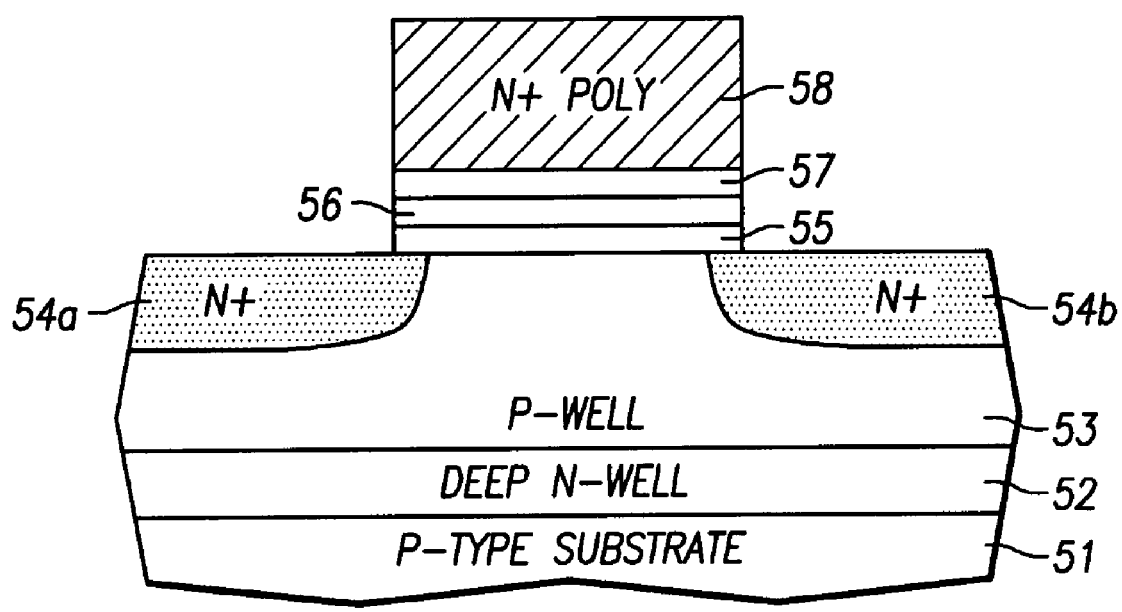
FIG. 5 is cross-sectional view showing a flash memory device in accordance with a first exemplary embodiment of the present invention.

FIG. 5 is cross-sectional view showing a non-volatile (e.g., flash) memory device in accordance with a first exemplary embodiment of the present invention.

Referring to FIG. 5, a unit cell includes a semiconductor substrate 51 of a second conductive type, a deep well region 52 of a first conductive type formed in a lower part of the semiconductor substrate 51 (e.g., a portion of the substrate that is at least in part lower than a substrate portion used for other structures), and a well region 53 of the second conductive type formed in an upper part of the semiconductor substrate 51 (e.g., in the deep well 52). The well region 53 is electrically isolated from the semiconductor substrate 51 by the deep well region 52. The unit cell further includes a stack structure, formed in sequence on a channel region of the semiconductor substrate 51, having a tunnel oxide layer 55, a trap nitride layer 56, and a block oxide layer 57. The unit cell still further includes a gate 58, a source region 54a and a drain region 54b. The gate 58 is formed on the block oxide layer 57 and may comprise or consist essentially of polysilicon doped with first conductive type impurities. The source/drain regions 54a and 54b are formed by implanting first conductive type impurity ions into the surface of the second conductive type well region 53 in the semiconductor substrate, adjacent to both sides of the gate 58. The tunnel oxide layer 55, the trap nitride layer 56, and the block oxide layer 57, stacked as insulating layers between the semiconductor substrate 51 and the gate 58, are commonly called an ONO (oxide-nitride-oxide) layer.

The SONOS type flash memory device of the first embodiment uses CHEI (Channel Hot Electron Injection) programming and a Reverse Reading method for reading the programmed or erased state of the non-volatile memory cell (e.g., a "1" or "0" digital logic state, as the case may be).

In case of programming, bias applying conditions include applying a positive voltage to both the drain and the gate, and applying a ground potential to both the source and a body (e.g., the P-well). Thereby hot electrons are injected into and trapped in a trap level of the trap nitride layer near the drain region, causing an increase in the threshold voltage of the nonvolatile memory device.

In case of reading, bias applying conditions include applying a positive reference voltage to the gate, applying a positive voltage to the source, and applying a ground potential to both the drain and the body, thus knowing, detecting and/or reading the programming/erasing states.

An erasing method of the SONOS nonvolatile (or flash) memory device according to the first embodiment is as follows.

FIG. 7 is a waveform diagram of applied bias during erasing operation of a flash memory device in accordance with the present invention. As shown in FIG. 7, some electrons are erased by recombination in gate-to-drain HHI in a first step or time period (t1~t2), and other electrons that are not erased in the first time period are erased by recombination in gate-to-body tunneling in a second step or time period (t3~t4). In each erasing step, bias conditions applied to the gate 58, the source region 54*a*, the drain region 54*b*, and the body 51 are as follows:

Gate bias is a negative voltage (−Ve) applied to the gate 58 at a first time t1, maintained until a fourth time t4 when the tunneling operation is finished.

Drain bias is a positive voltage (+Vd) applied to the drain region 54*b* during the first time period t1~t2 and thereafter maintained in or at a floating state.

Body bias is ground (e.g., a zero voltage) except for the tunneling time period t3~t4 in which a positive voltage +Vb is applied.

While this erasing operation is performed, the source region 54*a* is maintained in a floating state.

As discussed above, if HHI erasing in the first time period t1~t2 and tunneling erasing in the second time period t3~t4 are used together, electrons tend not to accumulate near the drain edges, despite continuous programming/erasing operations and/or regardless of the number of programming/erasing cycles. Endurance of the device is therefore improved.

The speed of erasing by Hot Hole Injection (HHI) is very fast, so the erasing time depends mainly on the tunneling time period t3~t4.

Furthermore, a short gap (t2~t3) of time should be established after the first step (e.g., erasing by gate-to-drain hot hole injection) and before the second step (e.g., erasing by gate-to-body tunneling). This short gap of time comprises a predetermined time period t2~t3, or a time gap between discontinuing application of the drain bias (e.g., the drain entering a floating state) and application of the non-ground or positive body bias. This time gap is generally sufficient to prevent a body-to-drain P/N junction diode from turning on when the HHI erasing operation ends and the tunneling erasing operation starts.

Although FIG. 7 illustrates an exemplary tunneling erasing operation executed after an HHI erasing operation, it may be also possible to execute an HHI erasing operation after a tunneling erasing operation.

As discussed hereinbefore, the SONOS flash memory device according to the first embodiment uses CHEI programming and Reverse Reading in the structure where the gate 58 comprises polysilicon doped with first conductive type impurity ions (e.g., n-type dopant atoms). In addition, the device has a structure where the deep well region 52 of a first conductive type electrically isolates the well region 53 of a second conductive type from the semiconductor substrate 51, so it is possible to use HHI and tunneling erasing operations sequentially to increase programming/erasing operation speed and/or improve endurance (e.g., although programming/erasing operations are continuously performed, no adverse or significant number of electrons accumulate near the drain edges).

In addition to the above-described device having a first conductive type impurity doped gate, a non-volatile or flash memory device according to a second embodiment of the present invention has a gate doped with second conductive type impurities (e.g., p-type dopant atoms). The SONOS nonvolatile/flash memory device having the first conductive impurity doped gate has the following properties during an exemplary erasing operation.

Holes tunnel through the tunnel oxide layer from the second conductive type semiconductor substrate and are then injected into the valence band of the trap nitride layer. Thereafter, about one percent of the holes are trapped in the trap level of the trap nitride layer, whereas most holes (about ninety-nine percent of the holes) are drained to the valence band of the N+ type polysilicon gate. Further, electrons trapped in the trap level of the trap nitride layer before erasing operation are detrapped during erasing operation, tunnel through the tunnel oxide layer, and are then drained to the substrate. So, the threshold voltage of the SONOS flash memory device may decrease.

Such a flow of electrons is not necessary to erasing operation. This flow is caused by what is called Back Fowler Nordheim (F/N) Tunneling, wherein electrons existing in the conduction band of the gate tunnel through the block oxide layer and are then injected into the conduction band of the trap nitride layer.

While electrons are drained to the conduction band of the substrate through the tunnel oxide layer by Back F/N Tunneling, the tunnel oxide layer undergoes excessive F/N tunneling stress. This may produce a trap level between the substrate and the tunnel oxide layer or in the tunnel oxide layer, so endurance characteristics may deteriorate as programming/erasing operations are repeated.

Figure 6:
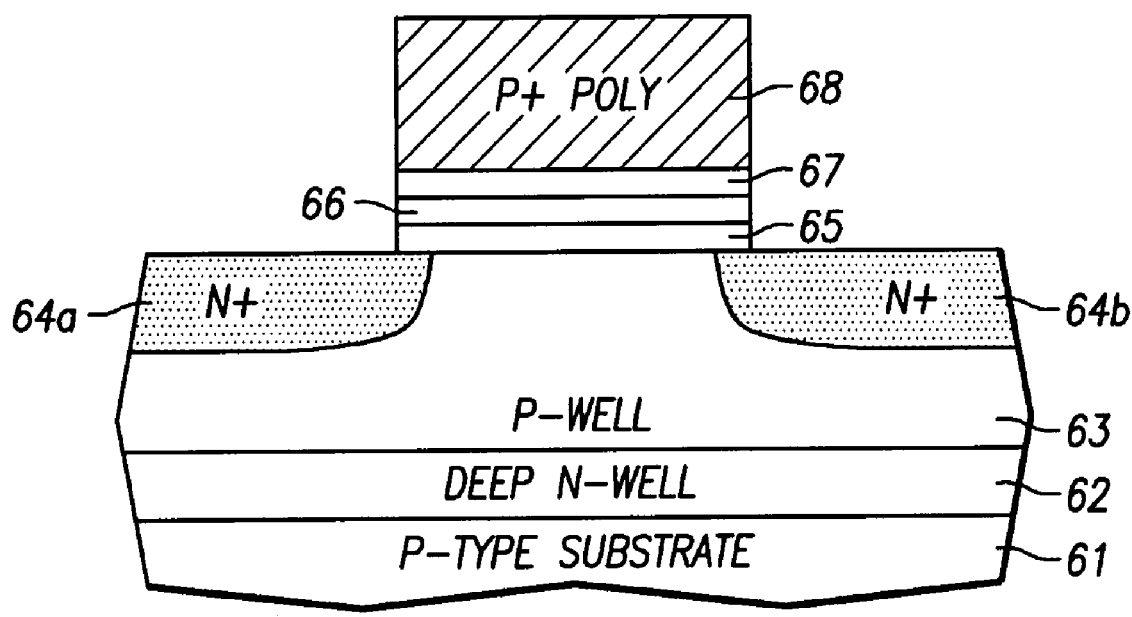
FIG. 6 is cross-sectional view showing a flash memory device in accordance with a second exemplary embodiment of the present invention.

To solve the above, the second embodiment of the present invention uses a different structure, where the gate comprises or consists essentially of polysilicon doped with second conductive type impurity ions. FIG. 6 is cross-sectional view showing a nonvolatile or flash memory device in accordance with a second exemplary embodiment of the present invention.

Referring to FIG. 6, a unit cell includes a semiconductor substrate 61 of the second conductive type, a deep well region 62 of the first conductive type formed in a lower part of the substrate 61, and a well region 63 of the second conductive type formed in an upper part of the substrate 61 (e.g., in deep well 62). The well region 63 is electrically isolated from the substrate 61 by the deep well region 62.

The unit cell further includes a stack structure, formed in sequence on a channel region of the substrate 61, having a tunnel oxide layer 65, a trap nitride layer 66, and a block oxide layer 67. The unit cell still further includes a gate 68, a source region 64a and a drain region 64b. The gate 68 is formed on the block oxide layer 67 and comprises or consists essentially of polysilicon doped with second conductive type impurities. The source/drain regions 64a and 64b are formed by implanting first conductive type impurity ions into the surface of the second conductive type well region 63 in the substrate 61, adjacent to both sides of the gate 68. The tunnel oxide layer 65, the trap nitride layer 66, and the block oxide layer 67 form what is called an ONO (oxide-nitride-oxide) layer stacked as insulating layers between the substrate 61 and the gate 68.

The SONOS type nonvolatile/flash memory device of the second embodiment uses CHEI (Channel Hot Electron Injection) programming and Reverse Reading.

In case of programming, bias applying conditions include applying a positive voltage to both the drain and the gate, and a ground potential to both the source and a body (e.g., the p-well 63). Thereby hot electrons are injected into and trapped in a trap level of the trap nitride layer near the drain region, causing an increase in the threshold voltage of the device.

In case of reading, bias applying conditions include applying a positive reference voltage to the gate, a positive voltage to the source, and a ground potential to both the drain and the body, thus knowing, detecting and/or reading the programming/erasing states.

An erasing method of the SONOS flash memory device according to the second embodiment is as follows.

As shown in FIG. 7, some electrons are erased by recombination in gate-to-drain HHI in a first step (t1~t2), and other electrons that are not erased in the first step are erased by recombination in gate-to-body tunneling in a second step (t3~t4). As discussed above, if HHI in the first time period t1~t2 and tunneling in the second time period t3~t4 are used together, electrons tend not to accumulate near the drain edges, despite continuous programming/erasing operations and/or regardless of the number of programming/erasing cycles. Endurance of the device is therefore improved.

In each erasing step, bias conditions applied to the gate 68, the source region 64a, the drain region 64b, and the body 61 are as follows.

Gate bias is a negative voltage (−Ve) applied to the gate 68 at the first time t1 and maintained until the fourth time t4 when the tunneling operation is finished.

Drain bias is a positive voltage (+Vd) applied to the drain region 64b during the first step t1~t2, and thereafter, the drain is maintained in a floating state.

Body bias is a ground potential (e.g., a zero voltage), except for the tunneling step t3~t4 in which a positive voltage +Vb is applied.

While this erasing operation is performed, the source region 64a is maintained in a floating state.

The speed of erasing by Hot Hole Injection (HHI) is very fast, so the erasing time depends mainly on the tunneling step t3~t4.

In particular, by using a p+-doped polysilicon gate, electrons generally are not inversely injected to the trap nitride layer 66 from the gate 68 during tunneling erasing operations, thus increasing erasing efficiency and speed.

As for the first embodiment above, a short gap of time (t2~t3) should be established after erasing by gate-to-drain hot hole injection and before erasing by gate-to-body tunneling starts. This short gap of time generally comprises a second step t2~t3 or a time gap between the drain bias and the body bias. This time gap is generally sufficient to prevent a body-to-drain P/N junction diode from turning on when an HHI erasing operation ends and when a tunneling operation starts.

Although FIG. 7 illustrates an exemplary tunneling erasing operation executed after an HHI erasing operation, it may be also possible to execute the HHI erasing operation after the tunneling erasing operation.

As discussed hereinbefore, the SONOS nonvolatile/flash memory device according to the second embodiment uses CHEI programming and Reverse Reading in the structure where the gate 68 comprises polysilicon doped with second conductive type impurity ions. In addition, the device has a structure such that the deep well region 62 of first conductive type electrically isolates the well region 63 of second conductive type from the substrate 61, so it is possible to use HHI and tunneling during sequential erasing operations to make programming/erasing operation speed faster and/or to improve device endurance (e.g., although programming/erasing operations are continuously performed and/or regardless of the number of programming and erasing cycles, an adverse or significant amount of electrons generally do not accumulate near the drain edges).

In the nonvolatile/flash memory device according to the present invention, the deep well region is useful and/or advantageous for the following reasons.

The deep well region is formed in general by conventional ion implantation. The deep well region is configured or adapted to apply a positive bias to the body during an erasing operation. This is the object of forming the deep well region.

If a p-well in a SONOS device is not isolated from a p-well in a logic NMOS transistor, a positive bias applied to the body of the deep n-well may also be applied to a p-well in the logic NMOS transistor. Unfortunately, this may cause undesirable, unexpected operations such as body-to-source or body-to-drain P/N junction diode turn-on in the logic NMOS transistor, and/or an increase in leakage current. Therefore, electrical isolation of the SONOS p-well using the deep n-well is useful and/or advantageous in executing or performing erasing operations by enabling application of a positive voltage to p-well (i.e., the body) in the SONOS device without adverse effects on other parts of or devices in the semiconductor chip.

As fully discussed hereinbefore, the nonvolatile/flash memory device of the present invention and related programming/erasing methods have several other advantages and effects, as follows.

First, the device of the invention provides a SONOS structure having a deep well region, uses Channel Hot Electron Injection (CHEI) programming and Reverse Reading, and uses sequential Hot Hole Injection (HHI) and tunneling during erasing operations, thus increasing programming/erasing operation speed.

Second, although programming/erasing operations are continuously performed, adverse accumulation of electrons generally does not happen near drain edges, so this invention may realize a SONOS device having excellent endurance characteristics and high performance.

Third, a SONOS structure that has a deep n-well and p+ polysilicon gate may allow an increase in thickness of a tunnel oxide layer under the gate, thus enhancing retention characteristics of the device. Also, in such a SONOS device, electrons generally are not inversely injected to a trap nitride layer from a gate during erasing operations, so electrons tend not to accumulate near drain edges, despite continuous programming/erasing operations and/or regardless of the number of programming/erasing cycles, thereby improving endurance characteristics.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of erasing a non-volatile memory device having a first conductive type deep well region in a semiconductor substrate, isolating a second conductive type well region having source/drain regions therein from the semiconductor substrate, the method comprising:
erasing first electrons by one of Hot Hole Injection or tunneling by applying a ground body bias in a first step; and
erasing second electrons that are not erased in the first step by the other of Hot Hole Injection or tunneling by applying a positive body bias voltage in a second step.

2. The method of claim 1, comprising applying a negative voltage to a gate in the first step and maintaining the negative voltage into the second step.

3. The method of claim 2, comprising applying a positive voltage to the drain region during the first step and maintaining a floating state thereafter.

4. The method of claim 1, comprising applying a positive voltage to the drain region during the first step and maintaining a floating state thereafter.

5. The method of claim 1, further comprising a time gap between the first and second steps.

6. The method of claim 5, wherein the time gap comprises a period of time sufficient to prevent a body-to-drain diode from turning on when the first step ends and when the second step starts.

7. The method of claim 1, wherein Hot Hole Injection comprises gate-to-drain Hot Hole Injection.

8. The method of claim 1, wherein tunneling comprises gate-to-body tunneling.

9. The method of claim 1, wherein the first step comprises erasing by gate-to-body tunneling.

10. The method of claim 1, wherein the first step comprises erasing by gate-to-drain hot hole injection.

11. A method of erasing a non-volatile memory device having a first conductive type deep well region in a semiconductor substrate, isolating a second conductive type well region having source/drain regions therein from the semiconductor substrate, the method comprising:
erasing first electrons by one of Hot Hole Injection or tunneling in a first step; and
after a time gap sufficient to prevent a body-to-drain diode from turning on when the first step ends and when a second step starts, erasing second electrons that are not erased in the first step by the other of Hot Hole Injection or tunneling in a second step.

12. The method of claim 11, comprising applying a negative voltage to a gate in the first step and maintaining the negative voltage into the second step.

13. The method of claim 12, comprising applying a positive voltage to the drain region during the first step and maintaining a floating state thereafter.

14. The method of claim 13, comprising applying a ground body bias in the first step, and in the second step, applying a positive body bias voltage.

15. The method of claim 11, comprising applying a positive voltage to the drain region during the first step and maintaining a floating state thereafter.

16. The method of claim 11, wherein Hot Hole Injection comprises gate-to-drain Hot Hole Injection.

17. The method of claim 11, wherein tunneling comprises gate-to-body tunneling.

18. The method of claim 11, wherein the first step comprises erasing by gate-to-body tunneling.

19. The method of claim 11, wherein the first step comprises erasing by gate-to-drain Hot Hole Injection.

* * * * *